(12) United States Patent
Chao et al.

(10) Patent No.: US 9,691,754 B2
(45) Date of Patent: Jun. 27, 2017

(54) SEMICONDUCTOR STRUCTURE

(71) Applicant: UNITED MICROELECTRONICS CORP., Hsinchu (TW)

(72) Inventors: Mei-Ling Chao, Hsinchu (TW); Yi-Chun Chen, Pingtung County (TW); Li-Cih Wang, Taoyuan (TW); Tien-Hao Tang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/691,126

(22) Filed: Apr. 20, 2015

(65) Prior Publication Data
US 2016/0293593 A1 Oct. 6, 2016

(30) Foreign Application Priority Data
Apr. 1, 2015 (CN) .......................... 2015 1 0150356

(51) Int. Cl.
*H01L 27/02* (2006.01)
*H01L 29/10* (2006.01)
*H01L 29/08* (2006.01)
*H01L 29/36* (2006.01)

(52) U.S. Cl.
CPC ...... *H01L 27/0266* (2013.01); *H01L 29/0847* (2013.01); *H01L 29/1095* (2013.01); *H01L 29/36* (2013.01)

(58) Field of Classification Search
USPC ......................................................... 257/355
See application file for complete search history.

(56) References Cited

U.S. PATENT DOCUMENTS

| | | | |
|---|---|---|---|
| 5,760,446 A * | 6/1998 | Yang .................... | H01L 27/0266 257/357 |
| 6,660,602 B1 | 12/2003 | Vashchenko et al. | |
| 2005/0051848 A1 * | 3/2005 | Ker .................... | H01L 21/82381 257/356 |
| 2010/0078724 A1 * | 4/2010 | Imoto ................. | H01L 27/0248 257/355 |

* cited by examiner

*Primary Examiner* — Zandra Smith
*Assistant Examiner* — Lawrence Tynes, Jr.
(74) *Attorney, Agent, or Firm* — WPAT, PC

(57) ABSTRACT

A semiconductor structure comprises a well, a first lightly doped region, a second lightly doped region, a first heavily doped region, a second heavily doped region and a gate. The first lightly doped region is disposed in the well. The second lightly doped region is disposed in the well and separated from the first lightly doped region. The first heavily doped region is disposed in the first lightly doped region. The second heavily doped region is partially disposed in the second lightly doped region. The second heavily doped region has a surface contacting the well. The gate is disposed on the well between the first heavily doped region and the second heavily doped region. The well has a first doping type. The first lightly doped region, the second lightly doped region, the first heavily doped region and the second heavily doped region have a second doping type.

15 Claims, 6 Drawing Sheets

SEMICONDUCTOR STRUCTURE

This application claims the benefit of People's Republic of China application Serial No. 201510150356.8, filed Apr. 1, 2015, the subject matter of which is incorporated herein by reference.

TECHNICAL FIELD

The disclosure relates in general to a semiconductor structure, and more particularly to a semiconductor structure comprising an electrostatic discharge (ESD) protection device.

BACKGROUND

Electrostatic discharge (ESD) may cause damage to sensitive electronic devices. As such, ESD protection devices are typically provided in semiconductor structures. There are several requirements for an ESD protection device to be achieved, such as human body model (HBM) standard and machine model (MM) standard. In the HBM standard, a 2 kV level is required. In the MM standard, a 200 V level is required.

A middle-voltage NMOS structure may be applied in an ESD protection device. However, a p-type ESD (hereinafter PESD) mask is needed to achieve the HBM and MM requirements. An ESD protection device saving the PESD mask may be beneficial for manufacturing cost, etc.

SUMMARY

The disclosure is directed to a semiconductor structure, which comprises an ESD protection device saving the PESD mask.

According to some embodiment, the semiconductor structure comprises a well, a first lightly doped region, a second lightly doped region, a first heavily doped region, a second heavily doped region and a gate. The well has a first doping type. The first lightly doped region is disposed in the well. The first lightly doped region has a second doping type. The second lightly doped region is disposed in the well and separated from the first lightly doped region. The second lightly doped region has the second doping type. The first heavily doped region is disposed in the first lightly doped region. The first heavily doped region has the second doping type. The second heavily doped region is partially disposed in the second lightly doped region. The second heavily doped region has the second doping type. The second heavily doped region has a surface contacting the well. The gate is disposed on the well between the first heavily doped region and the second heavily doped region.

Figure 1A:
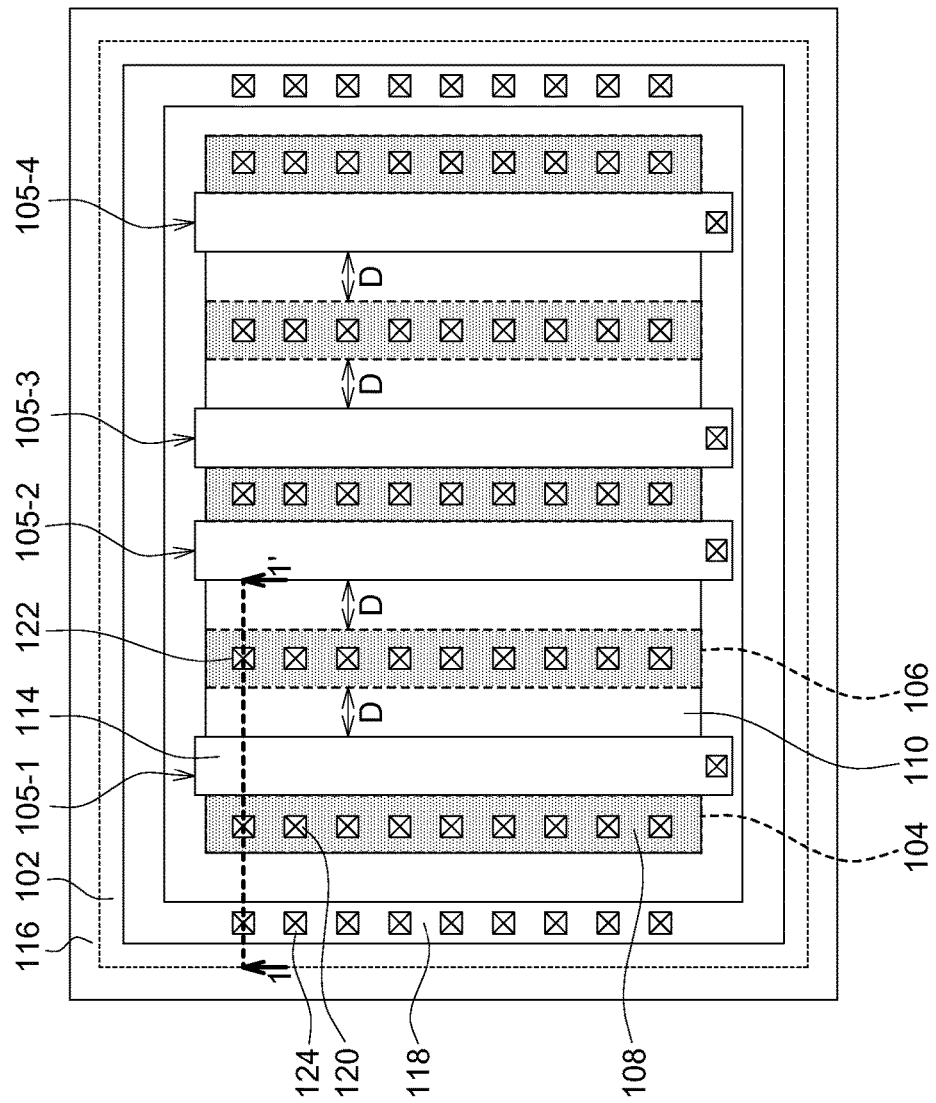
FIGS. 1A-1B show a semiconductor structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
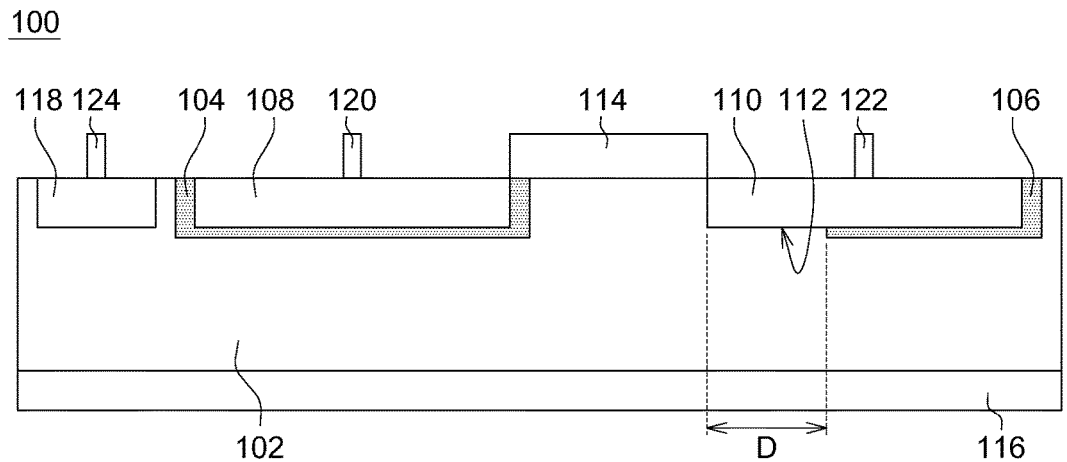

Referring to FIGS. 1A-1B, a semiconductor structure 100 according to one embodiment is shown. FIG. 1A shows a top view of the semiconductor structure 100. FIG. 1B shows a cross-sectional view of the semiconductor structure 100 roughly reflecting the cross section along 1-1' line in FIG. 1A.

The semiconductor structure 100 comprises a well 102, a first lightly doped region 104, a second lightly doped region 106, a first heavily doped region 108, a second heavily doped region 110 and a gate 114. The well 102 has a first doping type. The first lightly doped region 104 is disposed in the well 102. The first lightly doped region 104 has a second doping type. The second lightly doped region 106 is disposed in the well 102 and separated from the first lightly doped region 104. The second lightly doped region 106 has the second doping type. The first heavily doped region 108 is disposed in the first lightly doped region 104. The first heavily doped region 108 has the second doping type. The second heavily doped region 110 is partially disposed in the second lightly doped region 106. The second heavily doped region 110 has the second doping type. The second heavily doped region 110 has a surface 112 contacting the well 102. The gate 114 is disposed on the well 102 between the first heavily doped region 108 and the second heavily doped region 110.

In this embodiment, the surface 112 contacting the well 102 is located near the gate 114. According to one embodiment, the surface 112 contacting the well 102 preferably has a width D equal to or higher than 0.5 μm, such as equal to or higher than 0.75 μm, or equal to or higher than 1 μm. The upper limit of the width D is restricted by the rule of the second heavily doped region 110, such as 2.5 μm. Due to the surface 112 contacting the well 102, an additional PESD mask is unneeded.

In one embodiment, the first doping type is p-type, and the second doping type is n-type. In one embodiment, the first heavily doped region 108 and the second heavily doped region 110 comprise dopants of different concentrations implanted into different depths. For example, the first heavily doped region 108 and the second heavily doped region 110 may comprise phosphorus (P) of $3 \times 10^{13}$ $cm^{-3}$ with a depth of 4000 nm and arsenic (As) of $6 \times 10^{15}$ $cm^{-3}$ with a depth of 6000 nm. Further, the first lightly doped region 104 and the second lightly doped region 106 may comprise phosphorus of $2.9 \times 10^{13}$ $cm^{-3}$ with a depth of 9000 nm.

The semiconductor structure 100 may further comprise a deep well 116. The deep well 116 has the second doping type. The well 102 is disposed in the deep well 116. The semiconductor structure 100 may further comprise a third heavily doped region 118 disposed in the well 102. The third heavily doped region 118 has the first doping type. For example, the third heavily doped region 118 may comprise boron (B) of $3.15 \times 10^{15}$ $cm^{-3}$ with a depth of 800 nm and boron of $7 \times 10^{13}$ $cm^{-3}$ with a depth of 2000 nm. The semiconductor structure 100 may further comprise contacts 120, 122 and 124 connecting to the first heavily doped region 108, the second heavily doped region 110 and the third heavily doped region 118, respectively.

The semiconductor structure 100 may comprise a plurality of ESD protection devices 105-1 to 105-4. Each of them comprises the well 102, the first lightly doped region 104, the second lightly doped region 106, the first heavily doped region 108, the second heavily doped region 110 and the gate 114. In one embodiment, two adjacent ESD protection devices may share the second lightly doped region 106 and the second heavily doped region 110, such as the ESD protection devices 105-1 and 105-2. In another embodiment, two adjacent ESD protection devices may share the first lightly doped region 104 and the first heavily doped region 108, such as the ESD protection devices 105-2 and 105-3. The ESD protection devices 105-1 to 105-4 may achieve the HBM and MM requirements. In other words, the HBM test result of the ESD protection device 105-1/105-2/105-3/105-4 is equal to or higher than 2 kV, and the MM test result of the ESD protection device 105-1/105-2/105-3/105-4 is equal to or higher than 200 V.

Figure 2:
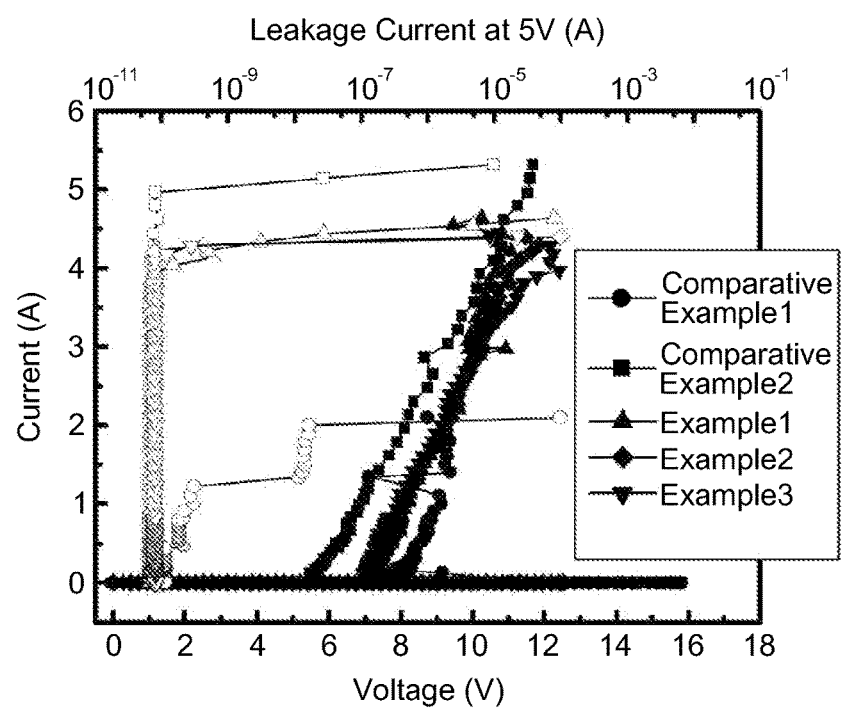
FIGS. 2-3 show features of examples/an example according to one embodiment.

Referring to FIG. 2, test results of examples according to this embodiment and comparative examples are shown. A typical middle-voltage NMOS without a PESD mask is used in comparative example 1. A middle-voltage NMOS with a PESD mask is used in comparative example 2. ESD protection devices according to the embodiment in which D=0.5 µm, D=0.75 µm and D=1 µm are used in examples 1, 2 and 3, respectively. Breakdown voltages (BV), Vt1s, It2s, HBM test results and MM test results are listed in Table 1. The Vt1 values of the examples according to the embodiment, 12.5 V, are lower than the junction breakdown voltage, which typically is about 15 V, and thereby high turn-on speed can be achieved. Besides, the holding voltages of the examples according to the embodiment are higher than circuit operation voltage. As such, the examples according to the embodiment can be used as ESD protection devices. Further, it is notes that, even the PESD mask is not used, the examples according to the embodiment have good ESD protection performance (HBM test result≥2 kV, MM test result≥200 V).

TABLE 1

| | BV (V) | Vt1 (V) | It2 (A) | HBM (kV) | MM (V) |
|---|---|---|---|---|---|
| comparative example 1 | 15 | 15.8 | 1.2 | 1.2 | 200 |
| comparative example 2 | 6.8 | 7.4 | 5 | 8 | 600 |
| example 1 (D = 0.5 µm) | 12 | 12.5 | 4.2 | 3.8 | 275 |
| example 2 (D = 0.75 µm) | 12 | 12.5 | 4.3 | 4.0 | 300 |
| example 3 (D = 1 µm) | 12 | 12.5 | 4.3 | 5.5 | 300 |

Figure 3:
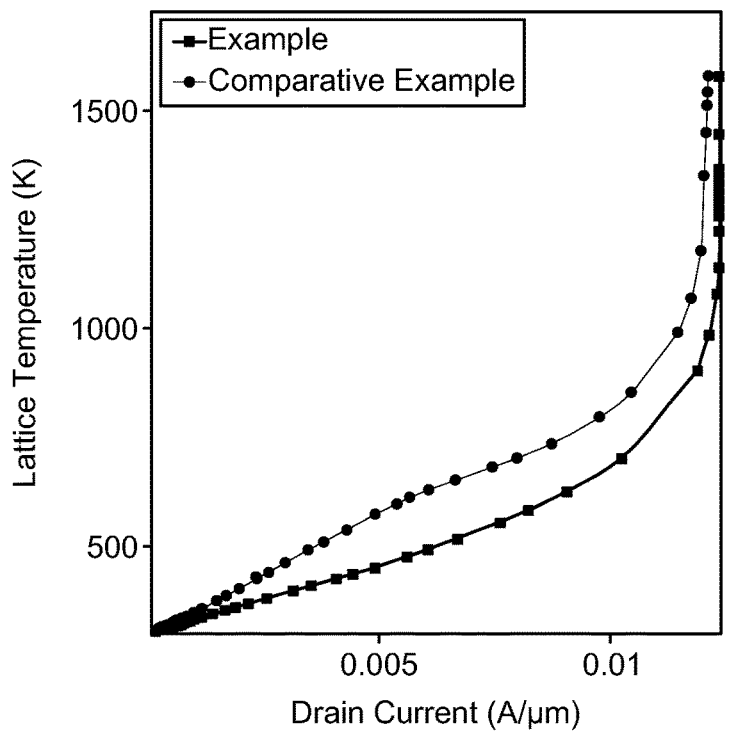
Figure 4:
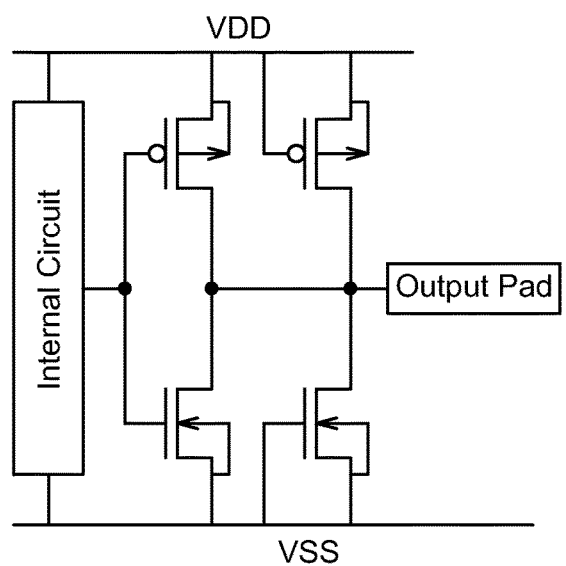
FIG. 4 shows a circuit in which a semiconductor structure according to one embodiment may be applied.

Referring to FIG. 3, simulation results of lattice temperatures of an example according to the embodiment and a comparative example are shown. It is noted that, under the same drain current, the lattice temperature of the example according to the embodiment is lower. As such, hot spot shrinks, or even disappears completely. FIG. 4 shows a circuit in which the semiconductor structure 100 may be applied.

Figure 5A:
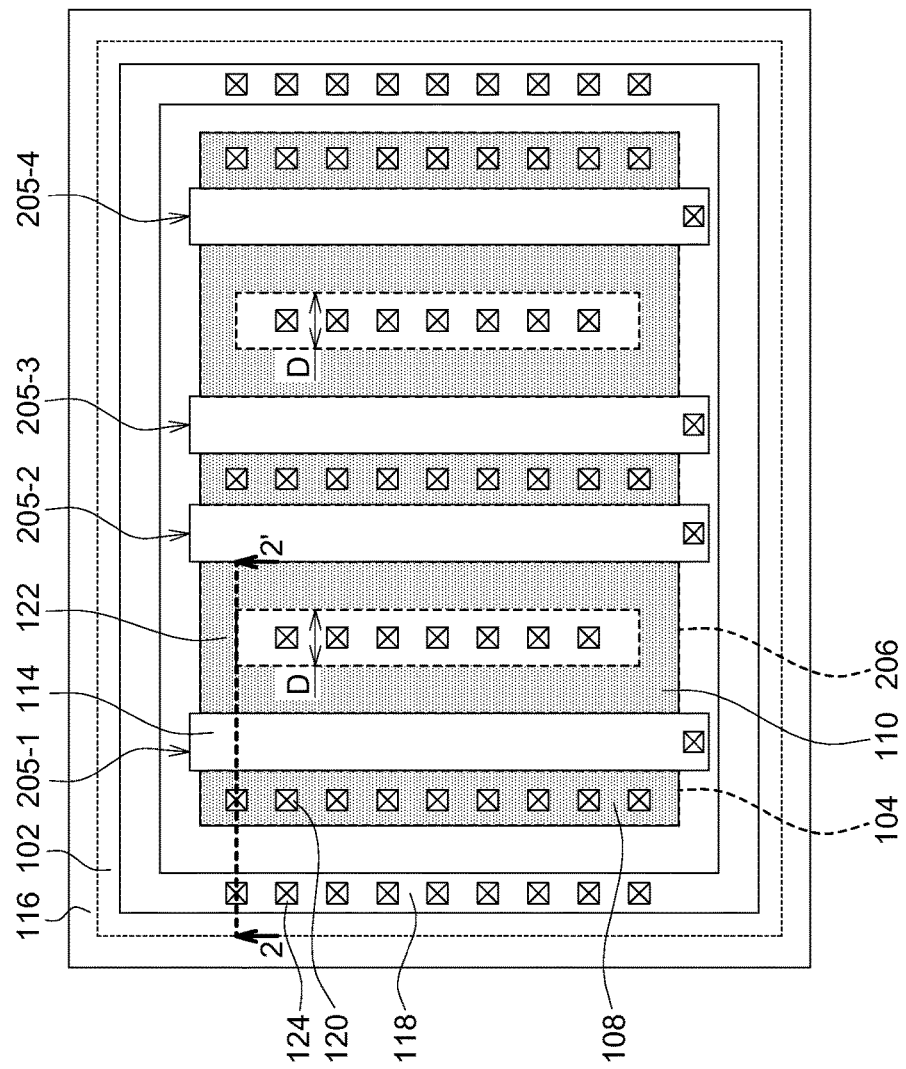
FIGS. 5A-5B show a semiconductor structure according to one embodiment.
Figure 5B:
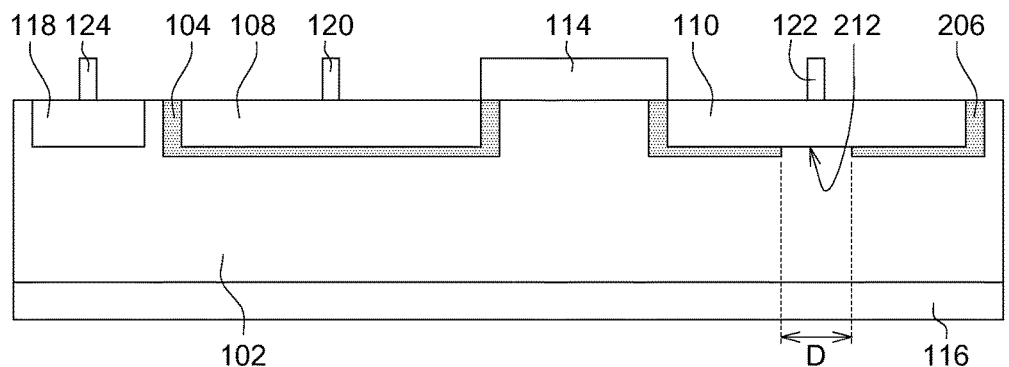

Now referring to FIGS. 5A-5B, a semiconductor structure 200 according to one embodiment is shown. FIG. 5A shows a top view of the semiconductor structure 200. FIG. 5B shows a cross-sectional view of the semiconductor structure 200 roughly reflecting the cross section along 2-2' line in FIG. 5A.

In this embodiment, the second lightly doped region 206 is configured such that the surface 212 contacting the well 102 is located in a middle area of the second heavily doped region 110. Other features of the semiconductor structure 200 are the same as the features of the semiconductor structure 100. According to one embodiment, the surface 212 contacting the well 102 preferably has a width D equal to or higher than 1 µm.

Figure 6:
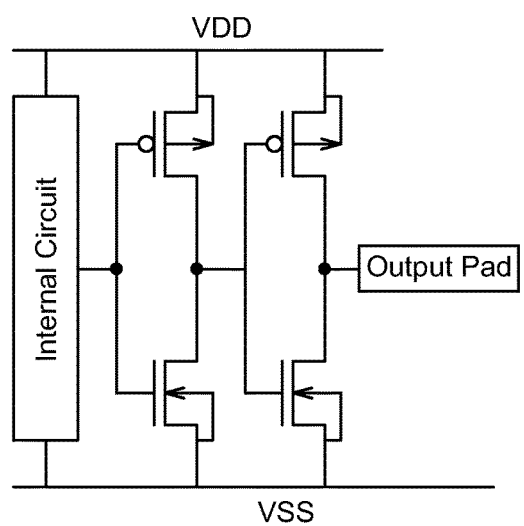
FIG. 6 shows a circuit in which a semiconductor structure according to one embodiment may be applied.

While not shown in the figures are listed here, the ESD protection devices 205-1 to 205-4 according to this embodiment can achieve the HBM and MM requirements. Further, hot spot shrinks in the example according to this embodiment. FIG. 6 shows a circuit in which the semiconductor structure 200 may be applied.

Figure 7:
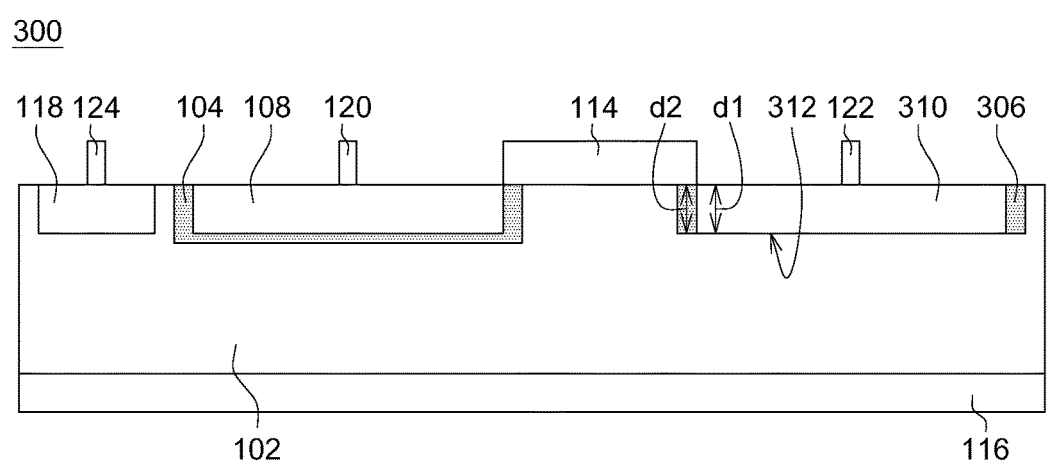
FIG. 7 shows a semiconductor structure according to one embodiment.

Referring to FIG. 7, a semiconductor structure 300 according to one embodiment is shown. More specifically, FIG. 7 shows a cross-sectional view of the semiconductor structure 300. In this embodiment, the second lightly doped region 306 and the second heavily doped region 310 are configured such that the second heavily doped region 310 has a depth d1 equal to or deeper than a depth d2 of the second lightly doped region 306, and thereby a surface 312 of the second lightly doped region 306 directly contacts the well 102. Other features of the semiconductor structure 300 are the same as the features of the semiconductor structure 100.

The semiconductor structure according to the embodiments can be easily fabricated by a typical MOS manufacturing process without an additional PESD mask. As such, the ESD protection function can be achieved by a lower cost.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a well having a first doping type;
   a first lightly doped region disposed in the well, the first lightly doped region having a second doping type;
   a second lightly doped region disposed in the well and separated from the first lightly doped region, the second lightly doped region having the second doping type;
   a first heavily doped region disposed in the first lightly doped region, the first heavily doped region having the second doping type, wherein the first lightly doped region covers at least a bottom surface of the first heavily doped region;
   a second heavily doped region partially disposed in the second lightly doped region, the second heavily doped region having the second doping type, wherein the second heavily doped region has a surface contacting the well; and
   a gate disposed above a region of the well which is located between the first heavily doped region and the second heavily doped region;
   wherein the second heavily doped region has a first sidewall and a second sidewall, the first sidewall is near the gate, the second sidewall is far from the gate, the first sidewall of the second heavily doped region contacts the well, and the second sidewall and a portion of the bottom surface of the second heavily doped region are encompassed by the second lightly doped region.

2. The semiconductor structure according to claim 1, wherein the first doping type is p-type, and the second doping type is n-type.

3. The semiconductor structure according to claim 1, wherein the surface contacting the well is located near the gate.

4. The semiconductor structure according to claim 1, wherein the surface contacting the well is located in a middle area of the second heavily doped region.

5. The semiconductor structure according to claim 1, wherein the depth of the second heavily doped region is equal to or larger than a depth of the second lightly doped region.

6. The semiconductor structure according to claim 1, wherein the surface contacting the well has a width equal to or higher than 0.5 μm.

7. The semiconductor structure according to claim 1, wherein the surface contacting the well has a width equal to or higher than 1 μm.

8. The semiconductor structure according to claim 1, further comprising:
a deep well having the second doping type, wherein the well is disposed in the deep well.

9. The semiconductor structure according to claim 1, further comprising:
a third heavily doped region disposed in the well, the third heavily doped region having the first doping type.

10. The semiconductor structure according to claim 1, comprising an ESD protection device which comprises the well, the first lightly doped region, the second lightly doped region, the first heavily doped region, the second heavily doped region and the gate.

11. The semiconductor structure according to claim 10, further comprising another ESD protection device, wherein the another ESD protection device and the ESD protection device share the second lightly doped region and the second heavily doped region.

12. The semiconductor structure according to claim 10, further comprising another ESD protection device, wherein the another ESD protection device and the ESD protection device share the first lightly doped region and the first heavily doped region.

13. The semiconductor structure according to claim 10, wherein an HBM test result of the ESD protection device is equal to or higher than 2 kV, and an MM test result of the ESD protection device is equal to or higher than 200 V.

14. The semiconductor structure according to claim 1, wherein the first heavily doped region and the second heavily doped region comprise dopants of different concentrations implanted into different depths.

15. A semiconductor structure, comprising:
a well having a first doping type;
a first lightly doped region disposed in the well, the first lightly doped region having a second doping type;
a second lightly doped region disposed in the well and separated from the first lightly doped region, the second lightly doped region having the second doping type;
a first heavily doped region disposed in the first lightly doped region, the first heavily doped region having the second doping type, wherein the first lightly doped region covers at least a bottom surface of the first heavily doped region;
a second heavily doped region partially disposed in the second lightly doped region, the second heavily doped region having the second doping type, wherein the second heavily doped region has a surface contacting the well; and
a gate disposed above a region of the well which is located between the first heavily doped region and the second heavily doped region;
wherein the second heavily doped region has a first sidewall and a second sidewall, the first sidewall is near the gate, the second sidewall is far from the gate, and a depth of a bottom part of the second lightly doped region formed on the first sidewall of the second heavily doped region is equal to a depth of the second heavily doped region.

* * * * *